(12) United States Patent
Miyata

(10) Patent No.: US 6,484,947 B1
(45) Date of Patent: Nov. 26, 2002

(54) PORTABLE INSTRUMENT FOR DATA STORAGE MEDIUM

(75) Inventor: Tsuneo Miyata, Ohtsu (JP)

(73) Assignee: Shinsei Kagaku Kogyo Co., Ltd., Ohtsu (JP)

(*) Notice: Subject to any disclaimer, the term of this patent is extended or adjusted under 35 U.S.C. 154(b) by 0 days.

(21) Appl. No.: 09/575,803

(22) Filed: May 22, 2000

(30) Foreign Application Priority Data

May 27, 1999 (JP) .......................................... 11-148168

(51) Int. Cl.[7] ................................................ G06K 19/06
(52) U.S. Cl. ...................................... 235/492; 235/487
(58) Field of Search .............................. 368/281, 282, 368/223; 235/375, 380, 381, 382, 487, 492, 493; 283/74, 75

(56) References Cited

U.S. PATENT DOCUMENTS

| | | | | |
|---|---|---|---|---|
| 5,241,161 A | * | 8/1993 | Zuta | 235/382 |
| 5,700,998 A | * | 12/1997 | Palti | 235/375 |
| 5,798,984 A | | 8/1998 | Koch | 368/10 |
| 5,841,738 A | * | 11/1998 | Kamei et al. | 368/205 |
| 5,844,244 A | * | 12/1998 | Graf et al. | 235/375 |
| 5,978,493 A | * | 11/1999 | Kravitz et al. | 283/75 |
| 6,065,681 A | * | 5/2000 | Trueggelmann | 235/487 |
| 6,164,815 A | * | 12/2000 | Degonda | 368/278 |

FOREIGN PATENT DOCUMENTS

| | | |
|---|---|---|
| JP | 4-249792 | 9/1992 |
| JP | 7-318668 | 12/1995 |
| JP | 3054683 | 9/1998 |

* cited by examiner

*Primary Examiner*—Michael G. Lee
*Assistant Examiner*—Jamara A Franklin
(74) *Attorney, Agent, or Firm*—Fitch, Even, Tabin & Flannery

(57) ABSTRACT

A data storage medium, which is for use in a non-contact type personal identification system composed of a data storage medium and an external processing unit for exchanging information with the data storage medium or for transmitting and receiving data to and from the data storage medium, can be easily integrated into a wristwatch without changing the internal structure of the watch. The data storage medium is composed of data storage elements and an antenna coil which are electrically connected to each other, being mounted on a base material. The data storage medium is made in the form of a non-contact type sheet-like tag, being externally sealed with are sin. The tag is secured to the surface of a transparent cover for covering the time display surface of the wristwatch, at a securing position which. allows recognition of the time displayed by time displaying elements.

6 Claims, 8 Drawing Sheets

PORTABLE INSTRUMENT FOR DATA STORAGE MEDIUM

BACKGROUND OF THE INVENTION

1. Field of the Invention

The present invention relates to a data storage medium for use in a non-contact type personal identification system and more particularly to a portable instrument for such a data storage medium.

2. Disclosure of the Prior Art

In recent years, a non-contact type personal identification system making utilization of data storage media is used as a means for facilitating the checking of visitors, the identifying of persons, or the administering of payments of fees etc. in recreation sites and facilities with a capacity of accommodating a large number of people such as sports stadiums, large-scale exhibition halls, amusement parks and skiing grounds, and the number of facilities which are introducing such a system is on the increase.

Concretely, a data storage medium containing a data storage means (e.g., IC chip) is handed to every visitor at the entrance gate of a facility and the entrance and leaving of the visitor is administered by external reading devices installed at several check points. In another example, information about bills for fees issued in a facility, skiing ground or sports stadium is written into the data storage medium by an external data processing unit in each location and the visitor pays his bills in a lump sum at the exit when he leave the site. The personal identification system is also used in a ticketless wicket system in railway stations.

In these cases, the data storage medium is taken out of a bag or the like as occasion arises for presentation to the reading section of the external reading device for information exchange or data recognition. However, it is troublesome to take the data storage medium in or out of the bag whenever presentation is requested. Moreover, if the visitor is frequently asked to take in and out his data storage medium, this would result in such troubles as the loss of the data storage medium.

One possible solution to the trouble of taking in and out of the data storage medium and the loss thereof is to form a portable instrument by integrating a data storage medium into an accessory. As one example of such a portable instrument for a data storage medium, there has been proposed a wristwatch such as shown in FIGS. 1 and 2, which contains an IC chip and an antenna for data transmission and reception .

As shown in FIG. 1, this instrument has an external appearance of an ordinary analog type wristwatch having a disk-shaped main body 1 and belts 10 which are respectively attached to the upper and lower ends of the main body 1 so as to continuously extend therefrom. It is seen from FIG. 2 that a movement 2 which is a mechanical part of the watch and an IC chip 6 serving as a data storage means are housed within a circular case 11, and that a core-less antenna coil 7 for transmitting and receiving data to and from an external reading device is disposed around the movement 2 and the IC chip 6 so as to be in internal contact with the peripheral wall of the case 11. The IC chip 6 and the antenna coil 7 are electrically connected to each other. Disposed above these elements is a time display section constituted by a dial 30 having FIGS. 1 to 12 thereon, a hour hand 31 and a minute hand 32, these hands receiving a watch shaft 3 which pierces through them, projecting from the movement 2. A transparent cover 4 is laid over the time display section to cover it.

The wristwatch in this example comprises the IC chip 6 and the antenna coil 7 and therefore functions as a data storage medium to transmit and receive, in a non-contact manner, data to and from a data transmitting/receiving section of an external data processing unit 8 provided for the personal identification system, as shown in FIG. 3. Since this instrument is designed to be carried, being attached to the wrist of a wearer like wristwatches, it saves the trouble of taking the data storage medium in and out of a bag or the like when transmitting or receiving data. Additionally, data can be transmitted or received with the instrument being attached to the wrist so that troubles such as losing is unlikely to occur. Another instrument similar to the above example is disclosed in Japanese Utility Model No. 3054683.

The instruments in both examples are designed to contain the IC chip 6 (i.e., data storage means) within the main body 1 and therefore require a space for accommodating the IC chip 6 and the antenna coil 7 within the mechanical part of the watch, which gives rise to a need for alterations in the structure of the movement 2. Further, a step for mounting the IC chip 6 and others needs to be added to the production process of the main body 1, which requires additions and alterations in the production line, resulting in increased production cost.

In addition, since the IC chip 6 is built in the mechanical part of the watch, it is difficult to replace the IC chip 6 after the watch is completed as a finished product.

SUMMARY OF THE INVENTION

A primary object of the invention is to easily integrate a data storage medium into a wristwatch without altering the internal structure of the wristwatch to form a portable instrument for a data storage medium, in which a non-contact type data storage medium for use in a non-contact type personal identification system is mounted on a wristwatch.

The above object can be achieved by a portable instrument for a data storage medium constructed according to the invention, wherein the data storage medium is composed of data storage means and an antenna coil which are electrically connected to each other, being mounted on a base material and is made in the form of a non-contact type sheet-like tag externally sealed with a resin, and wherein the tag is secured, at a securing position, to the surface of a transparent cover for covering a time display surface of a wristwatch, the securing position being such a position that allows recognition of the time displayed by time displaying means.

It does not matter for the data storage means whether data can be written therein, but the data storage means is required to have only the function of storing data. Concretely, it can be achieved by a memory means such as ROM or RAM used in an IC chip (regardless of the presence/absence of a CPU).

The time displaying means is composed of a minute hand, a hour hand and a dial in the case of an analog type watch. In the case of a digital type watch (in which time is indicated by digits), the means is composed of digits displayed on a liquid crystal screen.

According to the above means, the data storage medium composed of the data storage means and the antenna coil constitutes. a non-contact type tag the exterior of which is sealed by a resin, and the tag is independent of the mechanical part of the wristwatch to which the tag is secured. Since the tag is designed to be secured to the surface of the transparent cover which covers the time display surface of the wristwatch, there is no need to alter the design of other parts (i.e., internal structure) of the wristwatch than the transparent cover.

The time display section is made to be recognizable not only by arranging the area covered by. the secured tag to be out of the time display section, but also by using a transparent resin for forming the entire or parts of the tag so that the time displayed on the time display section can be recognized through the transparent resin portion of the tag in cases the tag is secured so as to cover the time display section.

The invention having the above structure has the following inherent effects.

As the non-contact type tag for data transmission and reception is independent of the mechanical part of the wristwatch and simply fixed to the surface of the cover of the wristwatch, major design changes other than the cover is unnecessary. Therefore, the wristwatch and the tag can be manufactured separately, and the wristwatch can be obtained by employing a ready-made wristwatch with a minor change made in the cover for enabling the secure attachment of the tag to the cover. This allows the production of the instrument in small lots and simplifies the manufacturing process, resulting in reductions in manufacturing cost.

Other objects, features, aspects and advantages of the invention will become more apparent from the following detailed description of embodiments with reference to the accompanying drawings and claims.

DETAILED DESCRIPTION OF THE EMBODIMENT

An embodiment of the present invention explained above will be described in detail with reference to the accompanying drawings.

Figure 1:
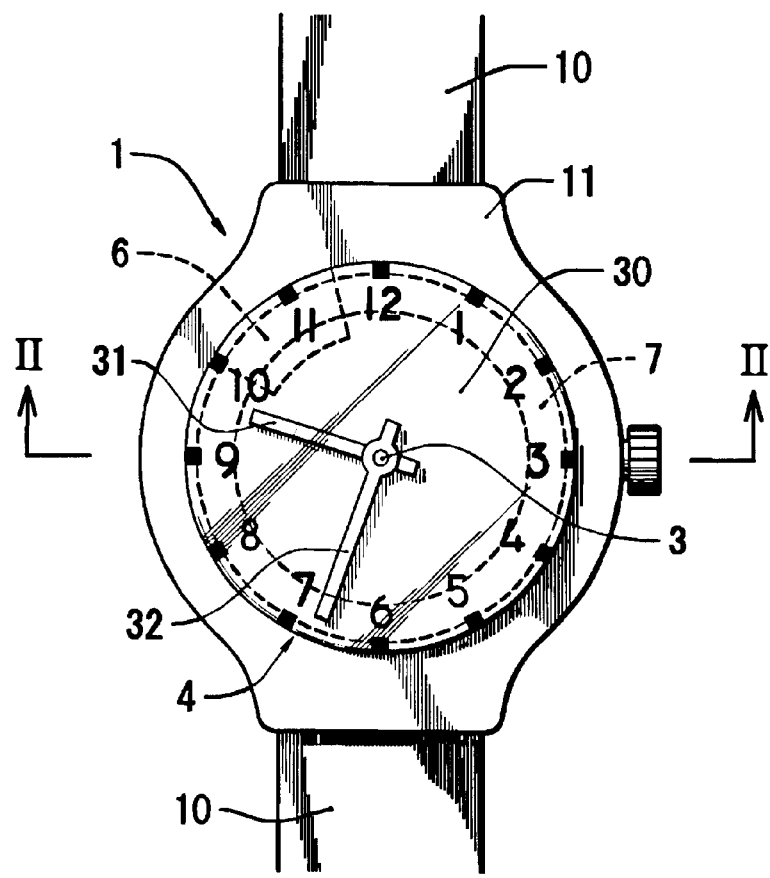
FIG. 1 is a plan view of a conventional wristwatch with a data storage medium.
Figure 2:
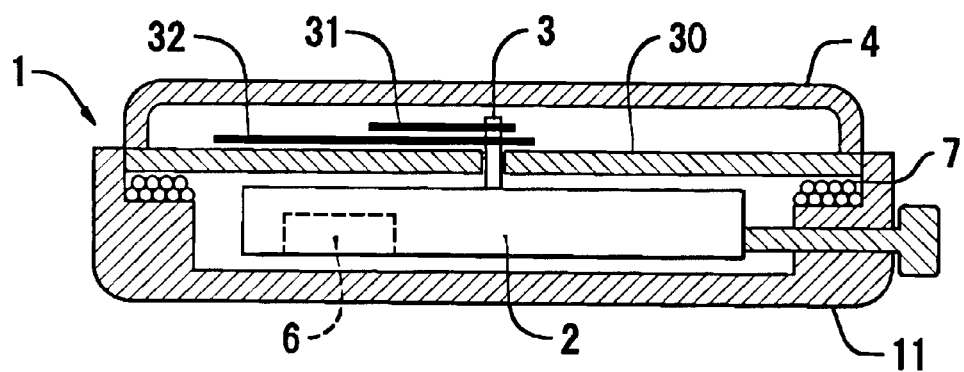
FIG. 2 is a sectional view taken on line II—II in FIGURE 1.
Figure 3:
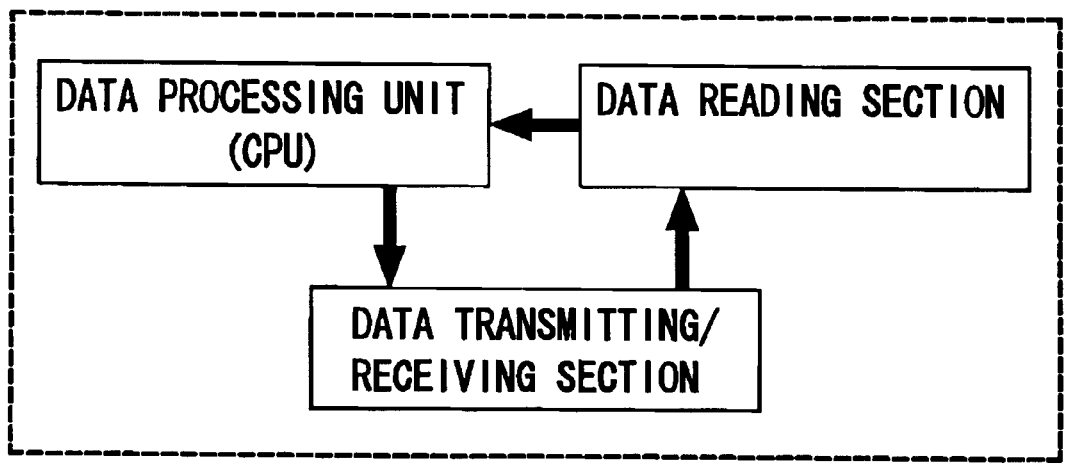
FIG. 3 diagrammatically shows a personal identification system making use of a wristwatch with a data storage medium.
Figure 3:
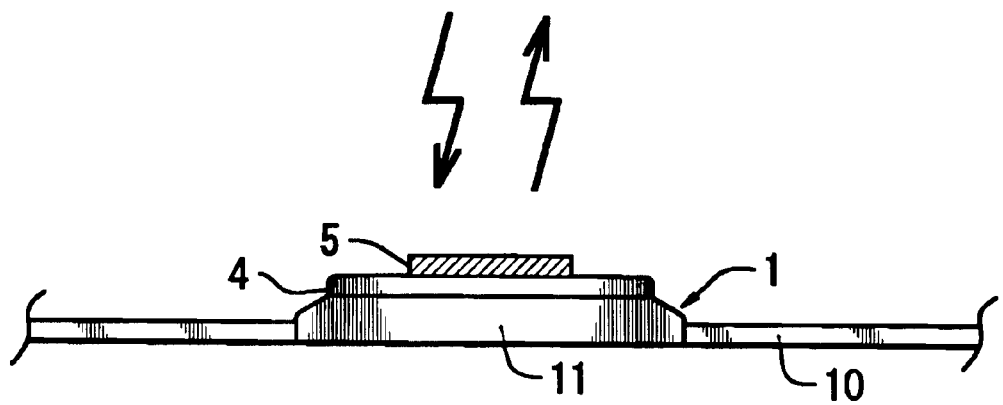
Figure 4:
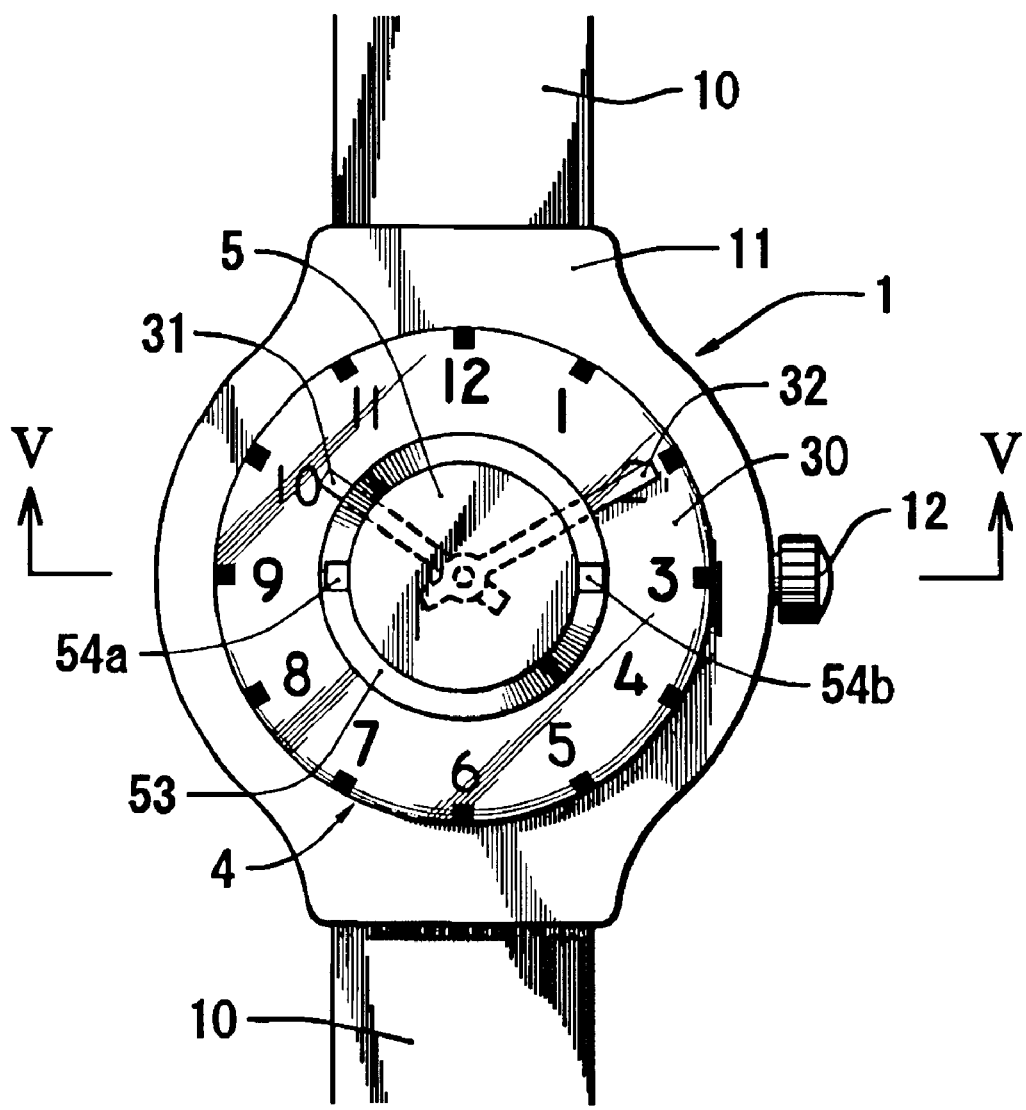
FIG. 4 is a plan view of a wristwatch with a data storage medium according to one embodiment of the invention.
Figure 5:
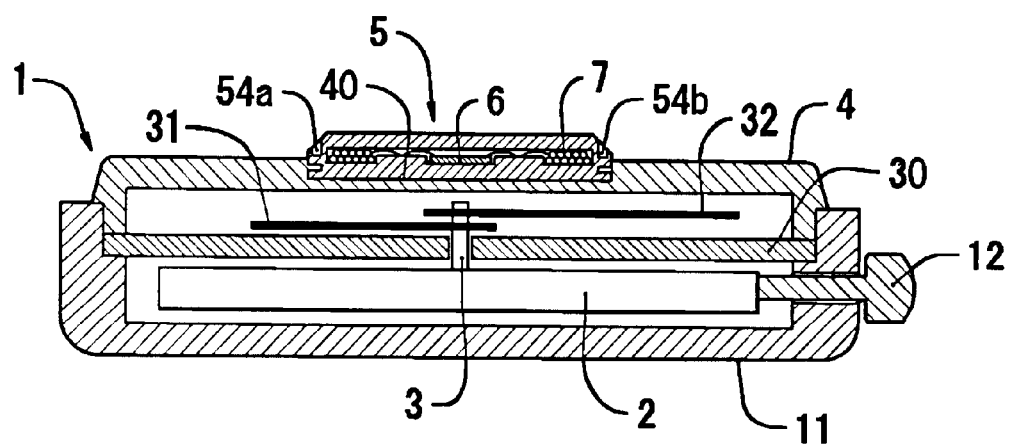
FIG. 5 is a sectional view taken on line V—V in FIG. 4.

FIGS. 4 and 5 show one example of wristwatches with a data storage medium. wherein a non-contact tag 5 is removably attached to a main body 1 of an ordinary analog type wristwatch.

As shown in FIG. 4, the watch body 1 has a substantially circular case 11. The case 11 has links which are formed in a vertical direction (i.e., in a six o'clock to 12 o'clock direction) to receive watchbands 10. It is seen from FIG. 5 that a movement 2 serving as an actuating section, a disk-like dial 30, a hour hand 31 and a minute hand 32 are housed in this case 11 and a transparent cover 4 is laid over these elements. A winding crown 12 is positioned at the right of the case 11, which is coupled to the movement 2, penetrating through the peripheral wall of the case 11.

Defined at the center of the transparent cover 4 is a circular recess 40 having a depth equal to about one half the thickness of the transparent cover 4. The disk-shaped non-contact tag 5 working as data storage means and having an IC chip 6 housed therein is fitted in the circular recess 40 such that its upper part partially projects above the transparent cover 4.

As shown in FIG. 4, the leading ends of the hour hand 31 and the minute hand 32 respectively extend beyond the outer peripheral edge of the non-contact tag 5 fixedly attached to the transparent cover 4. In the wristwatch, time is indicated by positions pointed by these hands 31, 32 and the figures marked on the dial 30 and can be recognized from outside.

Next, the non-contact tag 5 will be described.

Figure 6:
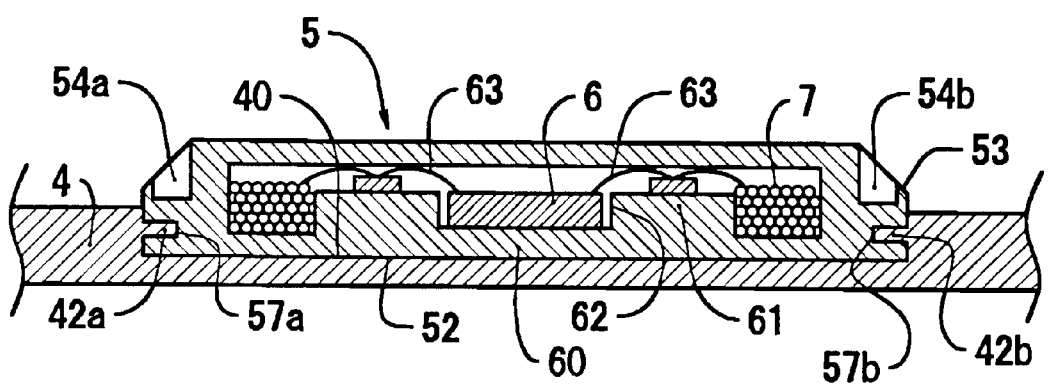
FIG. 6 is an enlarged sectional view of a non-contact tag portion shown in FIG. 4.
Figure 7:
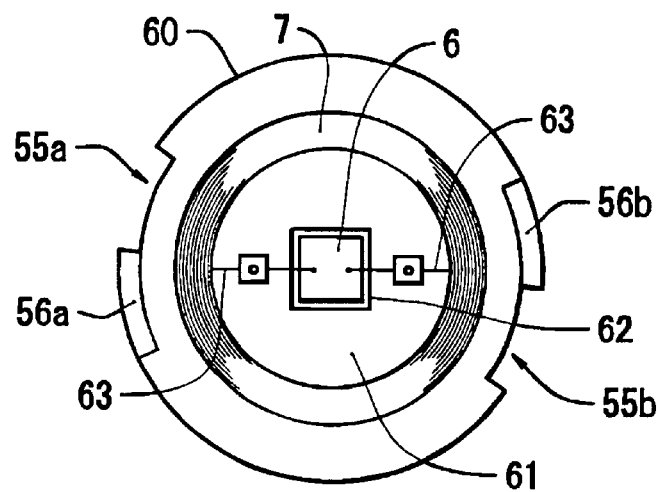
FIG. 7 is a transverse sectional view showing the internal structure of the non-contact tag shown in FIG. 4.

FIG. 6 is an enlarged view of the part where the non-contact tag 5 shown in FIG. 5 is secured to the transparent cover 4, and FIG. 7 is a transverse sectional view of the non-contact tag 5.

As seen from FIGS. 6 and 7, the non-contact tag 5 is designed to comprise a disk-shaped base material 60 which is made of a synthetic resin and includes a circular projection 61 having a rectangular mount hole 62 defined at its center for mounting the IC chip 6 therein. Mounted on the base material 60 are. the rectangular IC chip 6 and a core-less antenna coil 7 which is disposed so as to be in external contact with the peripheral wall of the circular projection 61. The IC chip 6 and the antenna coil 7 are electrically connected with each other by means of a wire 63, constituting a module.

The antenna coil 7 is made from a wire rod formed by coating. a conductor with an insulating layer. Specifically, it is made in the form of a core-less circular coil in such a way that when a wire rod is wound into a coil, adjacent turns are bonded to each other by an adhesive layer which is formed by coating on the external layer of the insulating layer.

The non-contact tag 5 is formed to have a specified external configuration and insulated such that the IC chip 6, the antenna coil 7 and their connections are entirely sealed by a synthetic resin. The side wall of the non-contact tag 5 is so molded as to fit the transparent cover 4 of the wristwatch.

The non-contact tag 5 has a chamfered face 53 at the peripheral edge of the upper face thereof and the chamfered face 53 has jig holes 54a, 54b of rectangular shape. Formed at the side wall under the jig holes 54a, 54b are inverted L-shaped grooves 57a, 57b which are composed of openings 55a, 55b and horizontal portions 56a, 56b. The openings 55a, 55b respectively open through an underside 52 whereas the horizontal portions 56a, 56b lead to the upper parts of the openings 55a, 55b and extend a specified distance in a circumferential direction of the side wall 50.

How to mount the non-contact tag will be described below.

Figure 8:
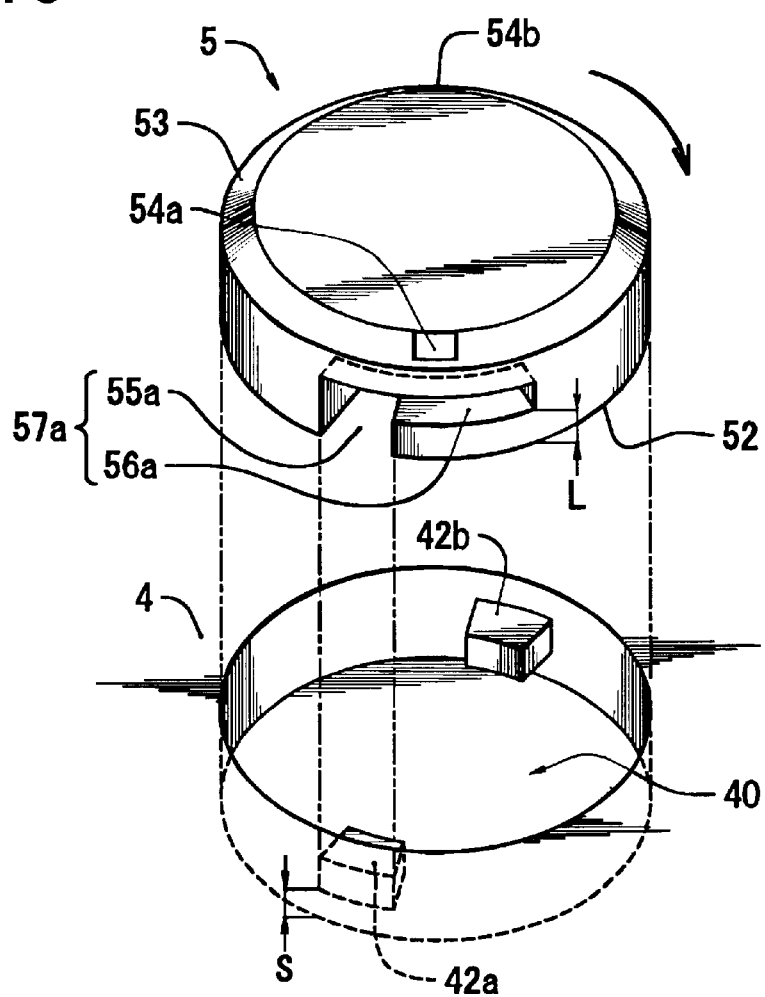
FIG. 8 is a perspective view showing a mounted condition of the non-contact tag.

The non-contact tag 5 is mounted with the bayonet method as shown in FIG. 8 in the recess 40 formed in the transparent cover 4 of the wristwatch.

An inside diameter of the recess 40 of the transparent cover 4 is arranged so as to fit the contour of the non-contact tag 5. Projections 42a, 42b are formed at the inner wall defining the recess 40, which respectively have a size corresponding to that of the openings 55a, 55b of the non-contact tag 5 and thickness corresponding to the width of the horizontal portions 56a, 56b of the grooves 57a, 57b. The level S of the securing position of the projections 42a, 42b from the bottom of the recess 40 corresponds to the distance L from the underside 52 of the non-contact tag 5 to the horizontal portions 56a, 56b.

When mounting the non-contact tag 5 in the recess 40, the non-contact tag 5 is first positioned such that the openings 55a, 55b are located above the projections 42a, 42b formed at the side wall 41 of the recess 40, and then, the non-contact tag 5 is inserted into the recess 40. In this case, the non-contact tag 5 can be pushed into the recess 40 accompanied with no resistance until the underside 52 touches the bottom face of the recess 40, because the openings 55a, 55b of the non-contact tag 5 are positioned in vertical direction with the projections 42, 42b. Then, the projections 42a, 42b of the recess 40 are placed in the positions which are located within the horizontal portions 56a, 56b of the non-contact tag 5 as well as just above the openings 55a, 55b. In this condition, the non-contact tag 5 is turned in the direction of arrow in FIG. 8, that is, in a clockwise direction, by use of jigs fitted in the jig holes 54a, 54b of the non-contact tag 5 so that the horizontal portions 56a, 56b are likewise turned in the same direction of arrow. Since the thickness of the projections 42a, 42b corresponds to the width of the horizontal portions 56a, 56b, the horizontal portions 56a, 56b move with the projections 42a, 42b being fitted in the horizontal portions 56a, 56b respectively, and the turn of the non-contact tag 5 is then stopped when the projections 42a, 42b have come into abutting contact with ends of the horizontal portions 56a, 56b, the ends being located on the opposite side to the openings 55a, 55b.

The non-contact tag 5 thus mounted is fixed to the recess 40, being prevented from coming off because the projections 42a, 42b of the recess 40 of the transparent cover 4 are fitted in the horizontal portions 56a 56b of the side wall 50 respectively as shown in FIG. 6.

The non-contact tag 5 can be easily taken from the transparent cover 4 by turning the non-contact tag 5 in the direction opposite to the direction of arrow, with the jig being fitted in the jig holes 54a, 54b.

The wristwatch with a data storage medium of this example is configured such that the non-contact tag 5 having the function of a data storage medium is mounted in the circular recess 40 formed at the center of the transparent cover 4 of the wristwatch, and therefore the integration of the wristwatch and the data storage medium (i.e., non-contact tag 5) can be easily accomplished. In addition, since the non-contact tag 5 is removably secured to the transparent cover 4 with the bayonet method, the tag can be easily replaced and utilized by being fixed to another wristwatch or to a different type of article. Further, this instrument can be suitably used in cases where only the tag 5 is removed from the wristwatch for collection when the wearer leaves the facility which utilizes a personal identification system by data storage medium.

The tag 5 is unlikely to come off the wristwatch even if a force or impact is imposed on it from outside, because it is secured to the wristwatch so as to be partially or entirely nested into the recess 40 formed in the transparent cover 4.

In addition, since the radius of the non-contact tag 5 is shorter than the lengths of the hour hand 31 and the minute hand 32 which constitute the time display section of the wristwatch, the leading ends of the hour hand 31 and the minute hand 32 extend beyond the region covered by the non-contact tag 5 so that the figures marked on the circumference of the dial 30 are not covered. With this arrangement, the time that the wristwatch is telling can be easily read even with the non-contact tag 5 attached to the transparent cover 4.

Although the non-contact tag 5 is made in disk form in the foregoing example, other shapes or arrangements may be employed as far as the minute hand 32 and the hour hand 31 can be recognized.

The condition meant by "the indication presented by the minute hand 32 and the hour hand 31 is recognizable" is such a condition that at least parts of the minute hand 32 and the hour hand 31 are out of the region concealed by the tag 5.

While the non-contact tag 5 is fitted in the transparent cover 4 with the bayonet method in the foregoing example, it may be fitted in using other methods although not shown herein. For instance, the non-contact tag 5 may be screwed into the transparent cover 4 by means of a screw thread formed on the sidewall 50 of the non-contact tag 5 and a thread groove defined in the recess side wall 41 of the transparent cover 4. Alternatively, fitting may be performed by a groove in the side wall 50 and a projection on the recess side wall 41.

Figure 9:
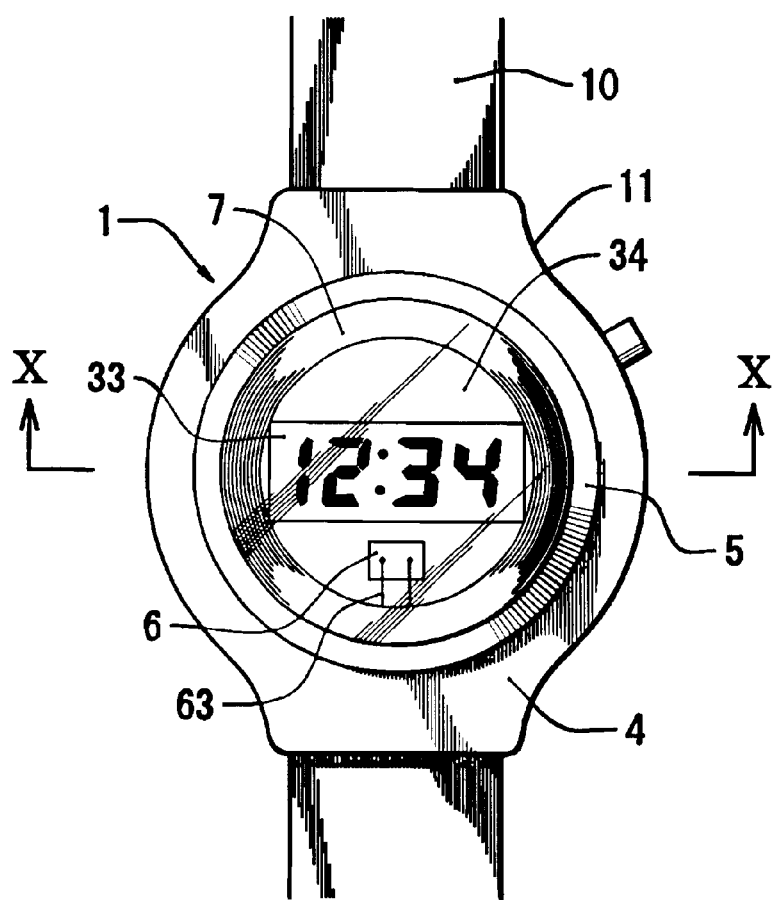
FIG. 9 is a plan view of a wristwatch with a data storage medium according to another example.
Figure 10:
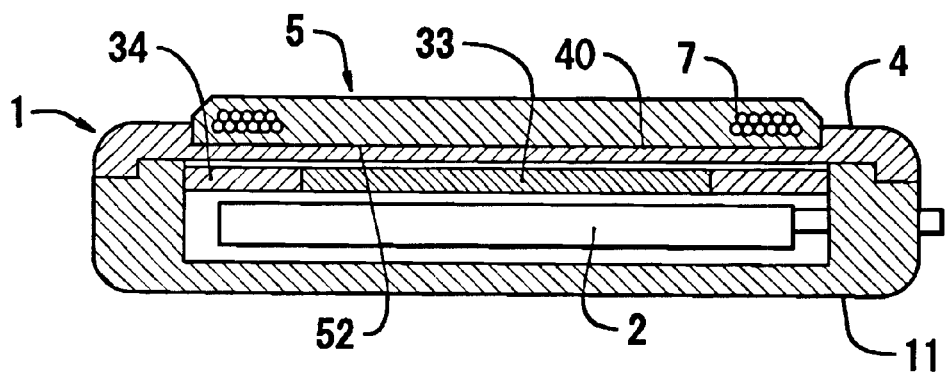
FIG. 10 is a sectional view taken on line X—X in FIG. 9.

FIGS. 9 and 10 show another example of wristwatches provided with a data storage medium, in which anon-contact tag 5 is removably secured to the watch body 1 of an ordinary digital type wristwatch having a rectangular liquid crystal display 33 as a time display section.

This wristwatch includes a movement 2 housed within a case 11 and a rectangular liquid crystal display 33 disposed on the center of its upper face. Disposed at the peripheral edge of the liquid crystal display 33 is a disk 34 having a rectangular aperture which fits the liquid crystal display 33. Laid over the disk 34 is a transparent cover 4 having a circular recess 40 which extends over almost the entire area of the transparent cover 4. The non-contact tag 5 is fixedly attached to the recess 40 with the bayonet method similarly to the foregoing embodiment.

The non-contact tag 5 secured to the transparent cover 4 is composed. of a core-less antenna coil 7 having a diameter larger than the width of the liquid crystal display 33 and an IC chip 6 accommodated in the area of the disk 34 enclosed by the antenna coil 7 and the liquid crystal display 33. Since the base material made of a synthetic resin on which the antenna coil 7 and the IC chip 6 are disposed and the synthetic resin used for sealing these elements are transparent, the time displayed on the liquid crystal display 33, which serves as a time display section and is located below the non-contact tag 5, can be recognized through the transparent portion unconcealed by the antenna coil 7 and the IC chip 6.

Accordingly, the indicated time of the wristwatch can be recognized even if the non-contact tag 5 is secured to the wristwatch so as to cover substantially the entire area of the transparent cover 4. While the non-contact tag 5 is sealed by an entirely transparent synthetic resin in this example, a synthetic resin partially transparent may be used as far as the displayed. time can be recognized.

Figure 11:
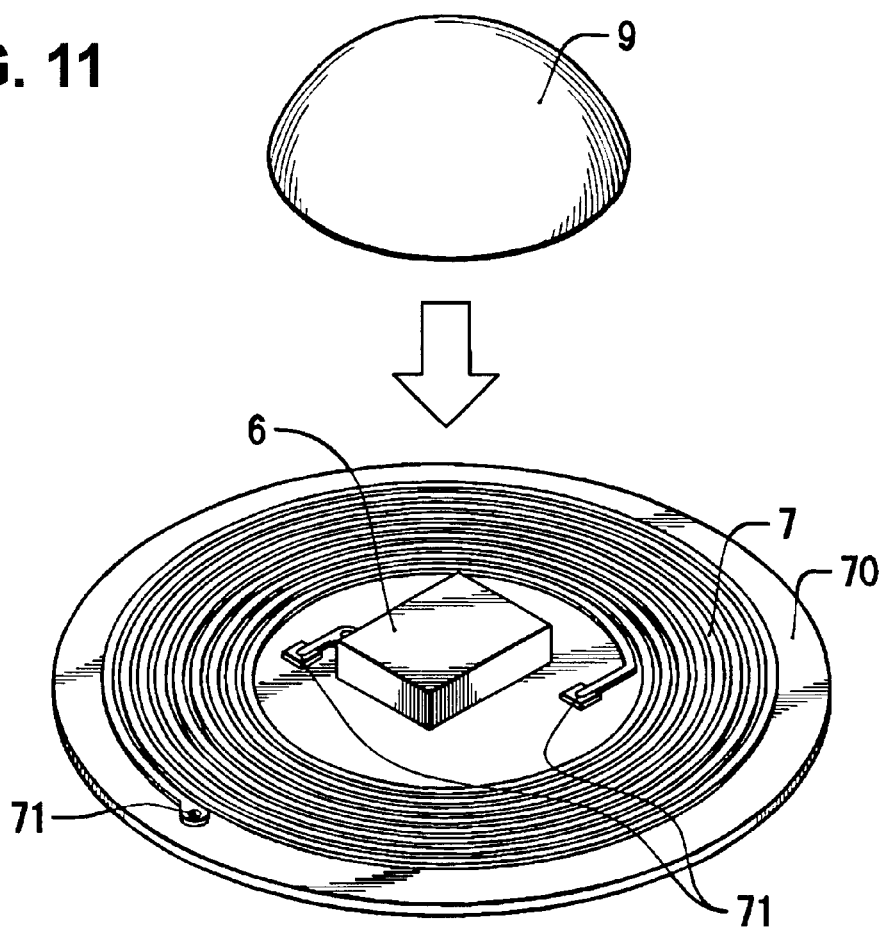
FIG. 11 is a perspective view of an IC module for use in a non-contact tag according to another example.
Figure 12:
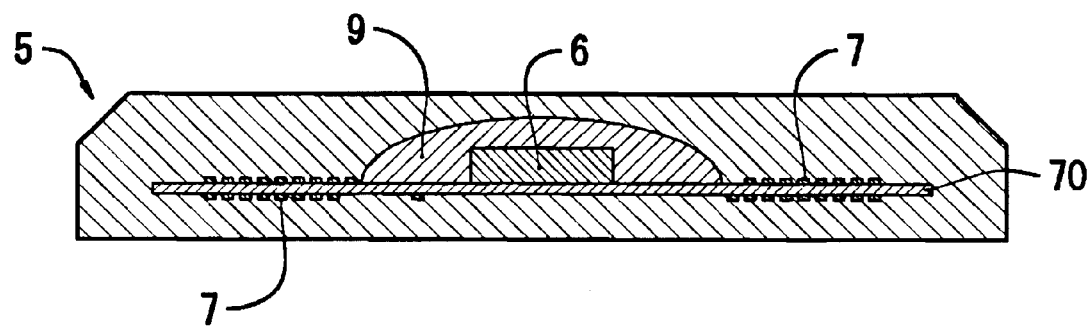
FIG. 12 is a sectional view of a non-contact tag according to another example.

As shown in FIGS. 11 and 12, the non-contact tag 5 may be formed in the following way. The antenna coils 7 are coaxially disposed on the front and back faces, respectively, of a base plate 70 made of a synthetic resin at the periphery thereof and the outer ends of the antenna coils 7 are connected to each other through a through hole 71 whereas the inner ends of the antenna coils 7 are connected to the IC chip 6. The IC chip 6 is potted using a sealing agent 9 composed of a synthetic resin (e.g., epoxy resin) and fixed to the surface of the base plate 70, thereby forming a non-contact IC module. This non-contact IC module is resin-sealed and formed into a tag shape.

Figure 13:
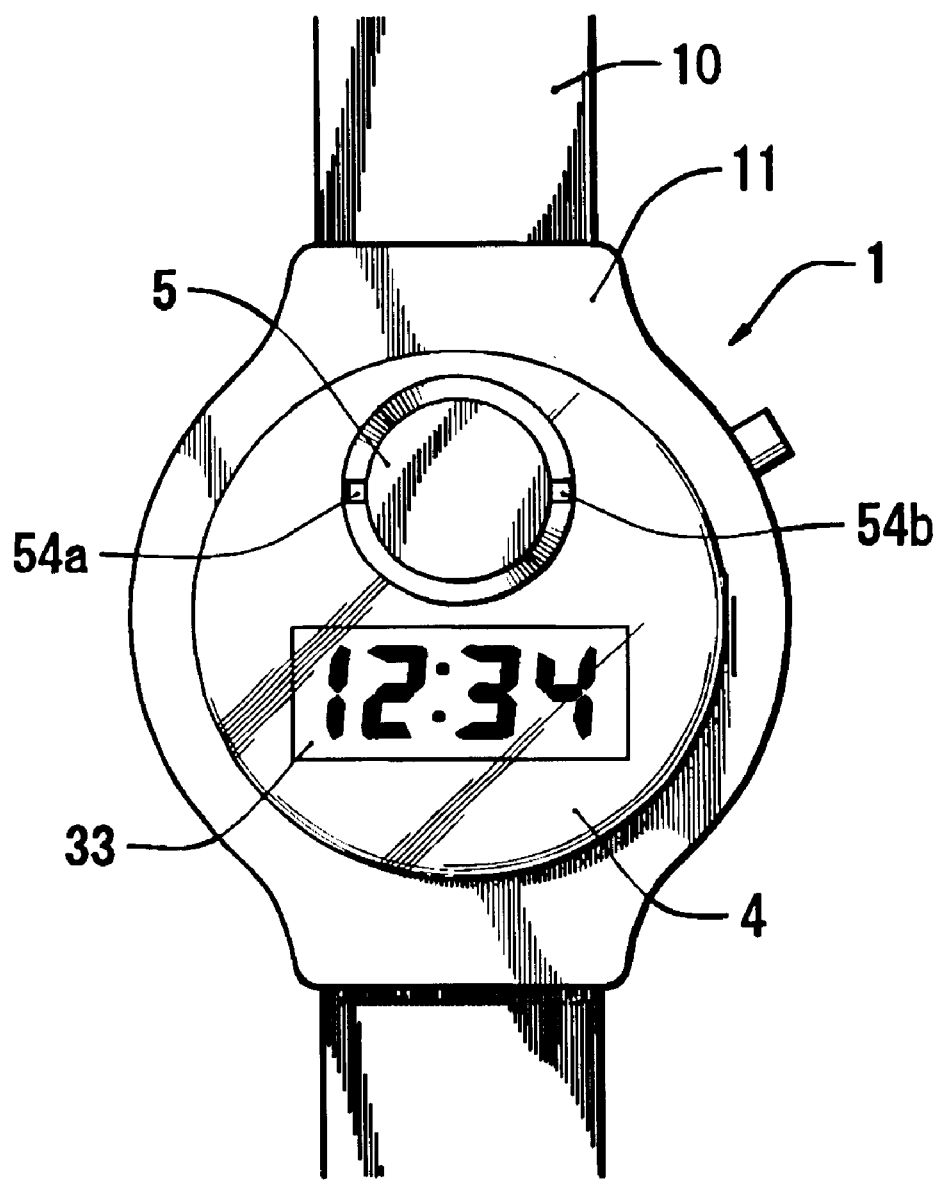
FIG. 13 is a plan view of a wristwatch with a data storage medium according to yet another example.

FIG. 13 shows a digital type wristwatch according to another example, in which a small-sized non-contact tag 5 is fixedly attached to a watch body 1. In this digital type wristwatch, the liquid crystal display 33 of the time display section is located lower than the center of the upper face of a case 11. In the transparent cover 4, the non-contact tag 5 is disposed above the liquid crystal display 33 in a plan view such that the non-contact tag 5 is juxtaposed with the liquid crystal display 33. The entire non-contact tag 5 is in the form of a disk having a shorter diameter than that of the transparent cover 4. Therefore, the time displayed on the liquid crystal display 33 is not concealed by the non-contact tag 5 but can be recognized. Similarly to the tags described earlier, this non-contact tag 5 contains an antenna coil 7 and the IC chip 6 (not shown) and the secure attachment of the non-contact tag 5 to the transparent cover 4 is carried out with the bayonet method. The digital type wristwatch shown in FIG. 13 has the same effects as the foregoing embodiments.

In the digital type wristwatches shown in FIGS. 9 and 13 to which the non-contact tag 5 is fixedly attached, various information from the IC chip 6 of the non-contact tags maybe displayed on the liquid crystal display 33 by receiving radio waves from an external processing unit.

In all of the wristwatches described above, a ready-made finished product produced by a watch maker is used for the mechanical part of the watch body 1 and only the transparent cover 4 is specially designed and manufactured so as to fit the non-contact tag 5. In some cases, the transparent cover 4 may be formed by adding the recess 40 to a ready-made transparent cover in post-processing.

What is claimed is:

1. A portable instrument for a data storage medium which is used for a non-contact personal identification system comprising a data storage medium and an external processing unit for exchanging information with the data storage medium or transmitting and receiving data to and from the storage medium, wherein the data storage medium is composed of data storage means and an antenna coil which are electrically connected to each other, being mounted on a base material and is made in the form of a non-contact tag externally sealed with a resin, wherein the tag is secured, at a securing position, to the surface of a transparent cover for covering a time display surface of a wristwatch, the securing position being such a position that allows recognition of the time displayed by time displaying means, wherein the transparent cover has a recess at said tag securing position and the tag is removably fitted in and secured to the recess, and wherein the transparent cover is for an analog wristwatch and has a size falling in a range which allows recognition of indications presented by a minute hand and a hour hand.

2. A portable instrument for a data storage medium according to claim 1, wherein the tag is in the form of a disk having a radius shorter than the length of the minute hand and is fitted in and secured to a circular recess formed coaxially with the circular transparent cover.

3. A portable instrument according to claim 1, wherein said tag comprises a sheet.

4. A portable instrument for a data storage medium which is used for a non-contact personal identification system comprising a data storage medium and an external processing unit for exchanging information with the data storage medium or transmitting and receiving data to and from the storage medium, wherein the data storage medium is composed of data storage means and an antenna coil which are electrically connected to each other, being mounted on a base material and is made in the form of a non-contact tag externally sealed with a resin, wherein the tag is secured, at a securing position, to the surface of a transparent cover for covering a time display surface of a wristwatch, the securing position being such a position that allows recognition of the time displayed by time displaying means, wherein the transparent cover is for a digital wristwatch and has a recess at said tag securing position and the tag is removably fitted in and secured to the recess.

5. A portable instrument for a data storage medium according to claim 4, wherein a liquid crystal display of the time displaying means is located below the center of the upper face of a case, and wherein the tag is in the form of a disk having a shorter radius than the transparent cover of the case and is fitted in and secured at a position upper than the position of the liquid crystal display on the transparent cover such that the tag is juxtaposed with the liquid crystal display in a plan view.

6. A portable instrument according to claim 4, wherein said tag comprises a sheet.

* * * * *